(12) United States Patent
Hoshikawa et al.

(10) Patent No.: US 11,427,425 B2
(45) Date of Patent: Aug. 30, 2022

(54) SPLICING TAPE MANAGEMENT SYSTEM

(71) Applicant: FUJI CORPORATION, Chiryu (JP)

(72) Inventors: Kazumi Hoshikawa, Toyohashi (JP);
Nobuhisa Komiyama, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 99 days.

(21) Appl. No.: 16/482,746

(22) PCT Filed: Feb. 20, 2017

(86) PCT No.: PCT/JP2017/006230
§ 371 (c)(1),
(2) Date: Aug. 1, 2019

(87) PCT Pub. No.: WO2018/150592
PCT Pub. Date: Aug. 23, 2018

(65) Prior Publication Data
US 2019/0352116 A1 Nov. 21, 2019

(51) Int. Cl.
*B65H 21/00* (2006.01)
*H05K 13/02* (2006.01)
*B65H 19/18* (2006.01)

(52) U.S. Cl.
CPC ......... *B65H 21/00* (2013.01); *B65H 19/1852* (2013.01); *H05K 13/0215* (2018.08); *B65H 2301/461* (2013.01)

(58) Field of Classification Search
CPC ............ H05K 13/021; H05K 13/0408; H05K 13/0417; H05K 13/0419; H05K 13/0215;
(Continued)

(56) References Cited

U.S. PATENT DOCUMENTS 4,411,725 A * 10/1983 Siegel ................. G03D 13/005
156/159
4,599,130 A * 7/1986 Woodley ............... B29C 69/005
156/497
(Continued)

FOREIGN PATENT DOCUMENTS

WO 2013/157107 A1 10/2013

OTHER PUBLICATIONS

Jobsite System Failures Involving Pressure Sensitive Adhesive Masking Tape Over Gypsum Board Substrates, Drywall Finishing Council, 2010. (http://dwfc.org/wp-content/files/2010_09_28_Pressure_Sensitive_Adhesive_Tape.pdf) (Year: 2010).*
(Continued)

*Primary Examiner* — George R Koch
(74) *Attorney, Agent, or Firm* — Oblon, McClelland, Maier & Neustadt, L.L.P.

(57) ABSTRACT

A splicing tape management system includes, in executing properly the management of a time limit of a splicing tape, a first storage section configured to store an identification code of a splicing tape for splicing a first carrier tape and a second carrier tape together and a usable time limit of the splicing tape while associating them with each other, and a management section configured to manage the use of the splicing tape based on the identification code and the usable time limit that are stored in the first storage section. The usable time limit is a timing when the use of the splicing tape is to be halted, the timing being determined based on a production time and a usable period after production of the splicing tape or based on a starting time in use and a usable period after starting time of the splicing tape.

22 Claims, 8 Drawing Sheets

(58) Field of Classification Search
CPC .............. B65H 19/1852; B65H 21/00; B65H 2301/461
See application file for complete search history.

(56) References Cited

U.S. PATENT DOCUMENTS

| | | | | |
|---|---|---|---|---|
| 5,515,600 | A * | 5/1996 | Iwasaki | H05K 13/0419 29/740 |
| 6,157,870 | A * | 12/2000 | Gfeller | B23P 19/001 700/231 |
| 6,694,606 | B1 * | 2/2004 | Ohashi | H05K 13/0417 29/740 |
| 9,573,783 | B2 * | 2/2017 | Chi | B65H 20/20 |
| 9,669,980 | B2 * | 6/2017 | Koyanagi | B65D 75/327 |
| 2018/0235120 | A1 * | 8/2018 | Hara | H05K 1/0269 |

OTHER PUBLICATIONS

Rutkiewicz, Mark, Pressure Sensitive Adhesive Life Definitions, Innovize, 2016. (https://www.innovize.com/files/2018/03/Pressure-Sensitive-Adhesive-Life-Definitions.pdf) (Year: 2016).*

Shelf Life of Adhesive Tapes, MBK Tape Solutions, 2020. (https://www.mbktape.com/pdf/Shelf-Life-of-PSA-Tape-20200515.pdf) (Year: 2020).*

International Search Report dated May 16, 2017 in PCT/JP2017/006230 filed on Feb. 20, 2017.

* cited by examiner

FIG. 10

| SUPPLY REEL HOLDING SECTION No | 1 | 2 | 3 | 4 |
|---|---|---|---|---|
| IDENTIFICATION CODE OF SPLICING TAPE | | | | |
| PRODUCTION TIME | | | | |
| STARTING TIME IN USE | | | | |
| USABLE PERIOD | | | | |
| USABLE TIME LIMIT | | | | |
| TOTAL NUMBER OF TIMES OF SPLICING | | | | |
| NUMBER OF TIMES OF SUCCESS | | | | |
| SUCCESS RATE | | | | |
| TEMPERATURE | | | | |
| PRESSURIZING TIME | | | | |
| ⋮ | | | | | ed. Therefore, the quality of the splicing tape used can be ensured, whereby the splicing tape can be used properly.

SPLICING TAPE MANAGEMENT SYSTEM

This application is a 371 of PCT/JP2017/006230, filing date Feb. 20, 2017.

TECHNICAL FIELD

The present application relates to a splicing tape management system.

BACKGROUND ART

As a device for mounting a component such as an electronic component on a board, a component mounter is known which installs a tape feeder for supplying a component. The tape feeder installs a reel. A carrier tape installing thereon multiple components arranged at a predetermined pitch is wound around the reel. The tape feeder conveys the carrier tape so that the components installed on the carrier tape are sequentially supplied to a component transfer position. The component mounter sequentially transfers components positioned in the component transfer positions so as to install them on a board.

In addition, the operator of the component mounter replenishes a tape feeder with components before a production line has to be stopped due to the components in the tape feeder running out. When replenishing the tape feeder with components, for example, a terminating end of the current carrier tape which is running out of components (hereinafter, referred to as an "old carrier tape") and an initiating end of a carrier tape for replenishment (hereinafter, referred to as a "new tape") are spliced together with a splicing tape (for example, refer to Patent Literature 1).

PATENT LITERATURE

Patent Literature 1: WO 2013/157107

BRIEF SUMMARY

Technical Problem

Incidentally, a splicing tape is coated in advance with an adhesive necessary for splicing an old carrier tape and a new carrier tape together. In general, the adhesive performance of a splicing tape changes with time. Therefore, it is important to manage usable time limits of splicing tapes in order to properly use the splicing tapes.

An object of the present description is to provide a splicing tape management system capable of appropriately managing usable time limits of splicing tapes.

Solution to Problem

The present description discloses a splicing tape management system comprising: a first storage section configured to store an identification code of a splicing tape for splicing a first carrier tape and a second carrier tape, associating with a usable time limit of the splicing tape; and a management section configured to manage the use of the splicing tape based on the identification code and the usable time limit which are stored in the first storage section.

According to the present disclosure, since the identification code and usable time limit of the splicing tape for splicing the first carrier tape and the second carrier tape together are linked with each other, the usable time limit management of the splicing tape can appropriately be executed. Therefore, the quality of the splicing tape used can be ensured, whereby the splicing tape can be used properly.

BRIEF DESCRIPTION OF DRAWINGS

FIG. 10 is a diagram illustrating examples of items stored in a storage section in association with an identification code of a splicing tape, that is, a supply reel.

DESCRIPTION OF EMBODIMENT

Hereinafter, an embodiment of a splicing tape management system will be described by reference to drawings.

1. Configuration of Splicing Tape Management System 1

Figure 1:
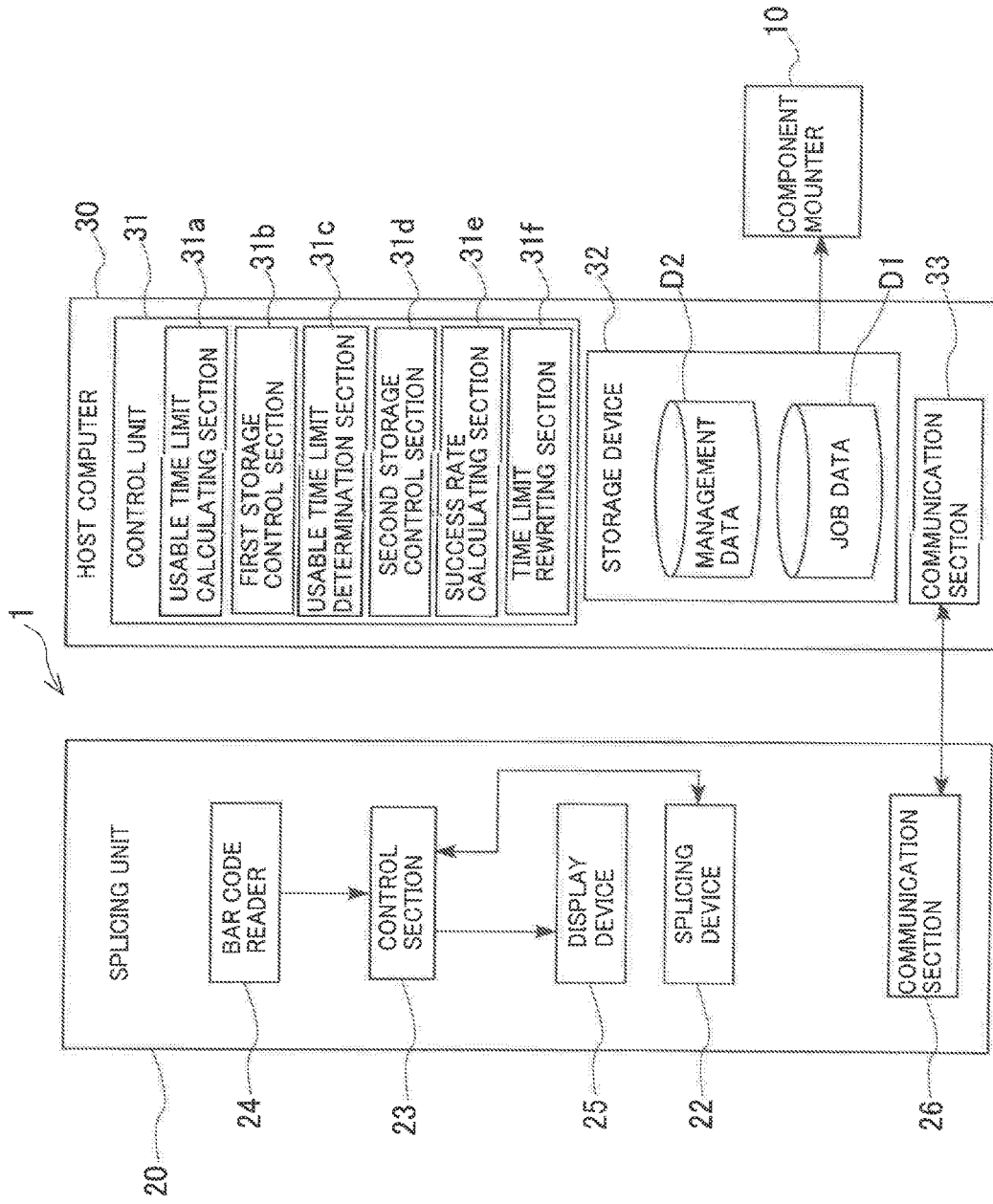
FIG. 1 is a block diagram of a splicing tape management system of an embodiment of the present disclosure.

Splicing tape management system 1 of an embodiment of the present disclosure is a system for managing splicing tapes for use in splicing two carrier tapes by being affixed individually to the two carrier tapes. As shown in FIG. 1, splicing tape management system 1 includes component mounter 10, splicing unit 20, and host computer 30. Component mounter 10 and host computer 30 are connected to communicate with each other. Additionally, splicing unit 20 and host computer 30 are connected to communicate with each other.

Figure 2:
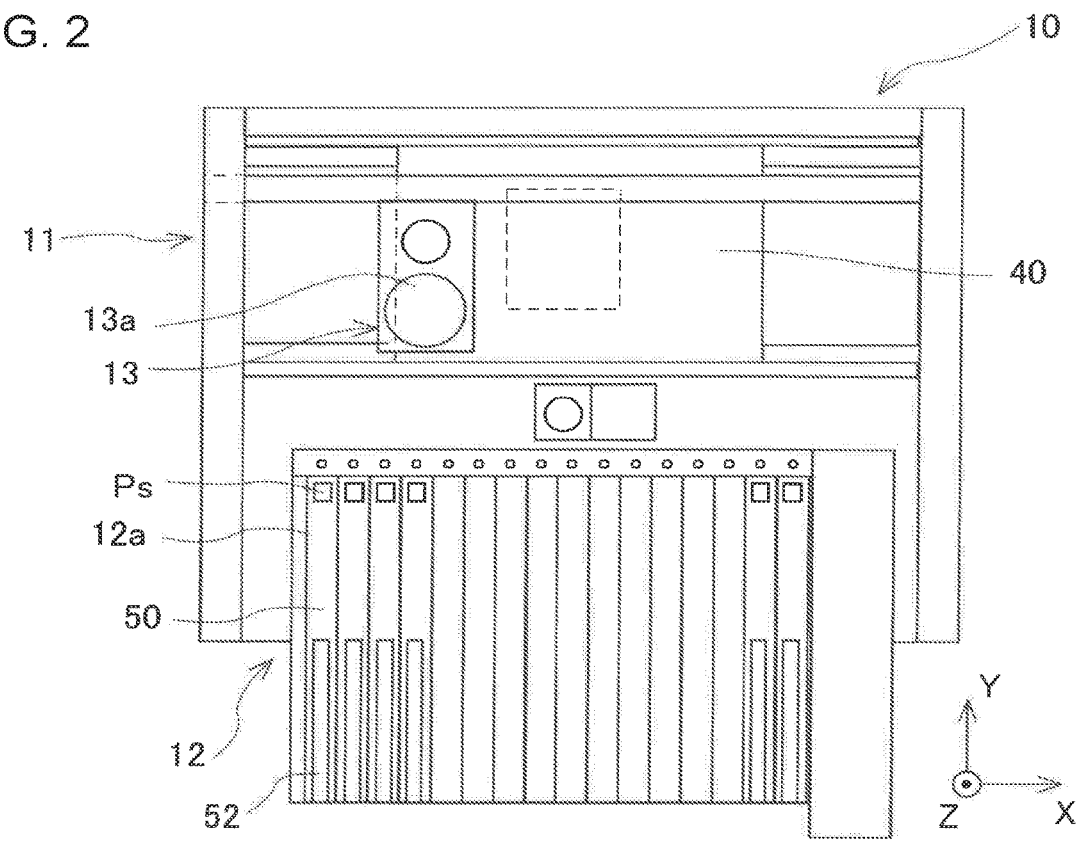
FIG. 2 is a plan view of a component mounter provided in the splicing tape management system according to the present embodiment.

Component mounter 10 is a device for mounting a component on a board. It should be noted that multiple component mounter 10 may be provided. As shown in FIG. 2, component mounter 10 includes board conveyance section 11, component supply section 12, component transfer section 13. Hereinafter, a horizontal conveyance direction (a left-right direction in FIG. 2) in which boards are conveyed will be referred to as an X-axis direction, a horizontal conveyance direction (an up-down direction in FIG. 2) in which components are supplied and which is orthogonal to the X-axis direction will be referred to as a Y-axis direction, and a direction which is orthogonal to the X-axis direction and the Y-axis direction (a direction directed from a front surface to a rear surface of a sheet of paper on which FIG. 2 is drawn or vice versa) will be referred to as a Z-axis direction.

Board conveyance section 11 is made up of a belt conveyor or the like and sequentially conveys boards 40 in the X-axis direction. Component supply section 12 supplies components such as electronic components that are to be mounted on board 40 to component transfer positions Ps. Component supply section 12 has multiple slots 12a that are arranged side by side in the X-axis direction. Tape feeder 50, which will be described in detail later, is detachably installed in each slot 12a. Slot numbers are set for slots 12a to identify themselves. Component supply section 12 moves carrier tape 51 wound around reel 52 installed in tape feeder 50 in the Y-axis direction using a motor and supplies components installed on carrier tape 51 to component transfer position Ps located on a leading end side of tape feeder 50.

Component transfer section 13 has mounting head 13a. Mounting head 13 can move in the X-axis direction and the Y-axis direction. A suction nozzle (not shown) is detachably attached to mounting head 13a. This suction nozzle can pick up a component by means of a negative pressure or the like. Mounting head 13a picks up a component supplied to component transfer position Ps using the suction nozzle and is thereafter moved to a position where the component that is so picked up is mounted on board 40 that is positioned in a predetermined mounting position by board conveyance section 11, whereupon mounting head 13 releases the suction of the component by the suction nozzle.

Figure 3:
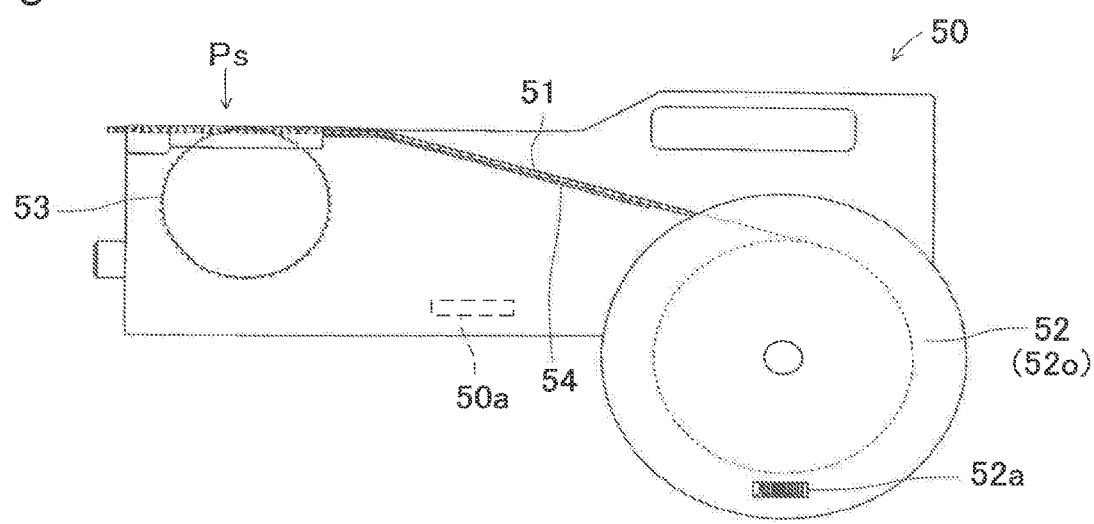
FIG. 3 is a side view of a tape feeder of the present embodiment.

Tape feeder 50 is installed in slot 12a of component supply section 12. As shown in FIG. 3, reel 52 is detachably loaded in tape feeder 50. Reel 52 is held rotatably relative to a main body of tape feeder 50. Carrier tape 51 is wound around reel 52. Components to be mounted on board 40 are installed on carrier tape 51 at a predetermined pitch.

Tape feeder 50 includes sprocket 53 and a motor (not shown). Sprocket 53 is rotatably supported on the main body of tape feeder 50 and includes teeth configured to be brought into meshing engagement with feed holes (not shown) on carrier tape 51. Sprocket 53 is rotated by an amount corresponding to one pitch at a time by the motor. Tape feeder 50 includes tape conveyance path 54. Tape conveyance path 54 supports carrier tape 51 fed from reel 52 loaded from below. Sprocket 53 is disposed below tape conveyance path 54 in such a manner that the teeth project through the corresponding feed holes to appear slightly from an upper surface of tape conveyance path 54. In the configuration of tape feeder 50, the motor is driven with the teeth of sprocket 53 kept in engagement with the feed holes on carrier tape 51 on tape conveyance path 54, whereby carrier tape 51 in question is drawn into component transfer position Ps.

Bar code 52a is attached to reel 52 to indicate an identification code for identifying reel 52. Bar code 52a is affixed to reel 52 in a sealed state. Bar code 52a is provided, for example, when a code of components (hereinafter, referred to as a component code) installed on carrier tape 51 wound around reel 52 are registered in association with reel 52. Feeder ID code 50a indicating an identification code for identifying tape feeder 50 is attached to tape feeder 50. Feeder ID code 50a is affixed to tape feeder 50 in a sealed state.

Figure 4:
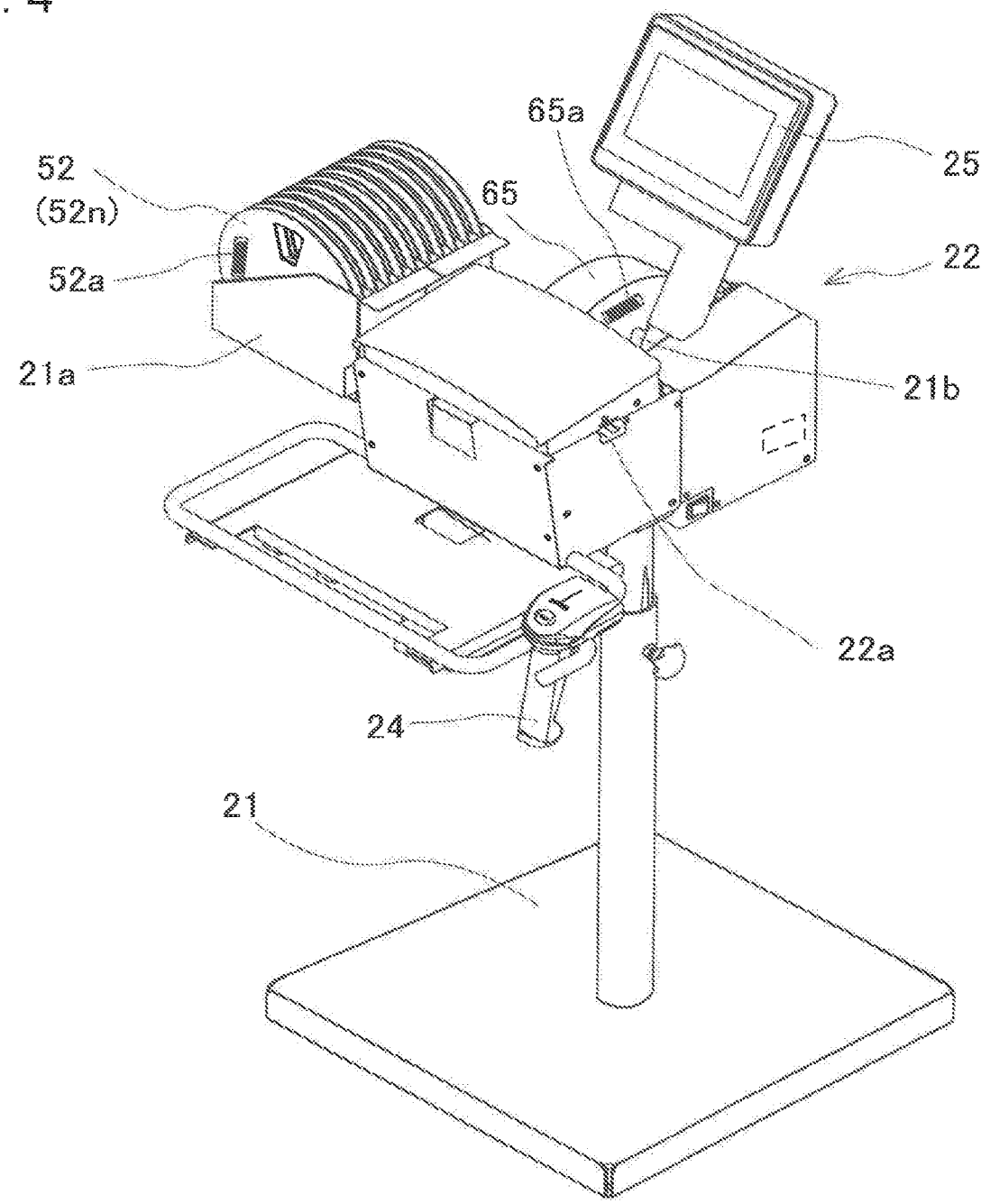
FIG. 4 is a perspective view of a splicing unit provided the splicing tape management system of the present embodiment.

As shown in FIG. 4, splicing unit 20 includes wheeled table section 21, splicing device 22, control section 23, bar code reader 24, display device 25, and communication section 26. Splicing unit 20 is movable on wheeled table section 21 in a production factory in which component mounter 10 is installed.

Splicing device 22 is a bonding device that automatically joins to bond (that is, splices) together a terminating end portion of carrier tape 51 (hereinafter, this carrier tape 51 will be referred to as old carrier tape 51o) wound around reel 52 installed in tape feeder 50 of component mounter 10 which is running out of components (hereinafter, referred to as loaded reel 52o) and an initiating end portion of carrier tape 51 (hereinafter, this carrier tape 51 will be referred to as new carrier tape 51n) wound around replenishing fresh or new reel 52 (hereinafter, referred to as replenishing reel 52n). Old carrier tape 51o and new carrier tape 51n are spliced together by splicing tape 60.

Splicing device 22 has a substantially rectangular parallelepiped shape that is long in one direction. Insertion openings 22a (only a front side one is shown in FIG. 4) are provided on both longitudinal side surfaces of splicing device 22. Insertion openings 22a on both the side surfaces communicate with each other via a feed groove (not shown). The feed groove is a groove for inserting two splicing target carrier tapes 51o and 51n, which are inserted from corresponding insertion openings 22a, to a central portion of splicing device 22.

Wheeled table section 21 is provided with a replenishing reel holding section 21a configured to hold replenishing reel 52n. Incidentally, multiple replenishing reel holding sections 21a may be provided, so that multiple replenishing reels 52n are held on wheeled table section 21. In splicing device 22, old carrier tape 51o wound around loaded reel 52o loaded in tape feeder 50 and inserted from first insertion opening 22a and new carrier tape 51n wound around replenishing reel 52n held to replenishing reel holding section 21a and inserted from second insertion opening 22a are butted against each other at a center of the device main body so as to be splined together with splicing tape 60.

Figure 5:
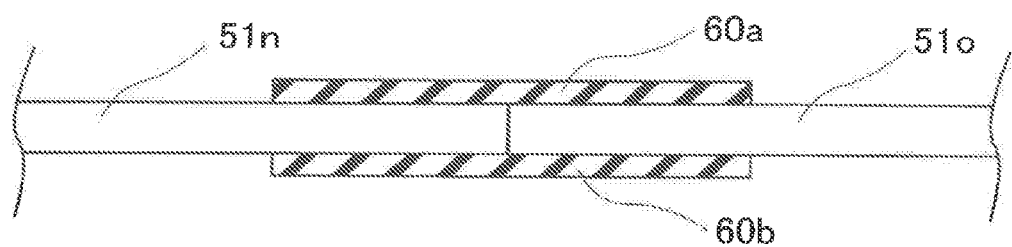
FIG. 5 is a diagram showing a state where a first carrier tape and a second carrier tape are spliced together using splicing tapes.

As shown in FIG. 5, splicing tape 60 is made up by combining two splicing tape portions 60a and 60b together. Splicing tape portion 60a is affixed to front surfaces of both old carrier tape 51o and new carrier tape 51n in such a manner as to extend over a butted area between old carrier tape 51o and new carrier tape 51n. Splicing tape portion 60b is affixed to rear surfaces of both old carrier tape 51o and new carrier tape 51n in such a manner as to extend over a butted area between old carrier tape 51o and new carrier tape 51n.

Figure 6:
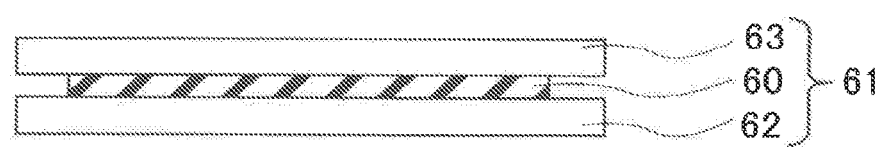
FIG. 6 is a diagram showing a splicing tape with backing paper prior to splicing.

As shown in FIG. 6, splicing tape supply member 61 is a member having a three-layer structure in which splicing tape 60 is sandwiched between two sheets of backing paper 62, 63. Sheets of backing paper 62, 63 are affixed individually to both surfaces of splicing tape 60 with an adhesive.

Splicing tape supply member 61 is wound around supply reel 65. Supply reel 65 is detachably loaded into splicing device 22. Wheeled table section 21 includes supply reel holding section 21b configured to hold supply reel 65. Bar code 65a indicating an identification code for identifying supply reel 65 is attached to supply reel 65. Bar code 65a is affixed to supply reel 65 in a sealed state. Bar code 65a is given, for example, when an identification code of splicing tape supply member 61 and hence splicing tape 60 is registered in association with supply reel 65 on which splicing tape supply member 61 in question is wound.

Of both the surfaces of splicing tape 60, a first surface that is affixed to carrier tape 51 (hereinafter, referred to as an affixing surface) constitutes a surface to which sheet of backing paper 62 is affixed. Of both the surfaces of splicing tape 60, a second or opposite surface of splicing tape 60 to the above-mentioned affixing surface constitutes a surface to which sheet of backing paper 63 is affixed. Hereinafter, sheet of packing paper 62 is referred to as affixing-side sheet of backing paper 62, while sheet of backing paper 63 is referred to as an opposite-side sheet of backing paper 63.

An adhesive force between splicing tape 60 and affixing-side sheet of backing paper 62 is smaller than an adhesive force between splicing tape 60 and opposite-side sheet of backing paper 63. Therefore, in splicing tape supply member 61, when affixing-side sheet of backing paper 62 is peeled off from splicing tape 60, splicing tape 60 is hardly peeled off from opposite-side sheet of backing paper 63. On the other hand, when the affixing surface of splicing tape 60 is affixed to carrier tape 51, an adhesive force between splicing tape 60 and carrier tape 51 is greater than an adhesive force between splicing tape 60 and opposite-side sheet of backing paper 63. Therefore, when opposite-side sheet of backing paper 63 is peeled off from splicing tape 60 after splicing tape 60 is affixed to carrier tape 51, splicing tape 60 is hardly peeled off from carrier tape 51.

Figure 7:
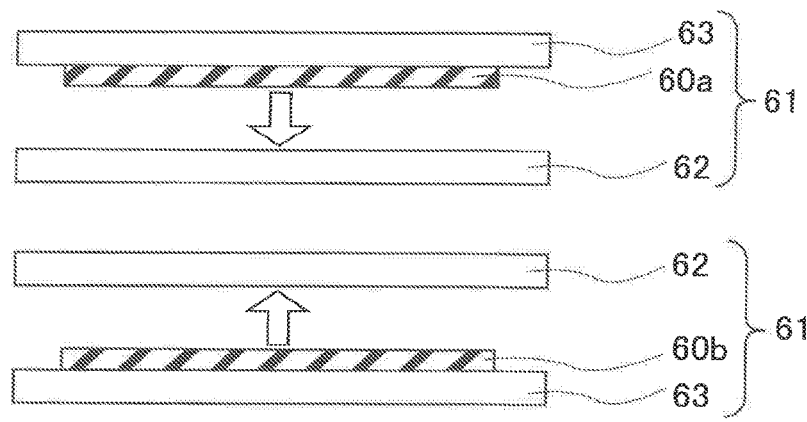
FIG. 7 is a diagram showing a state where one of sheets of backing paper is removed from each of two splicing tapes to be affixed to the first carrier tape and the second carrier tape.
Figure 8:
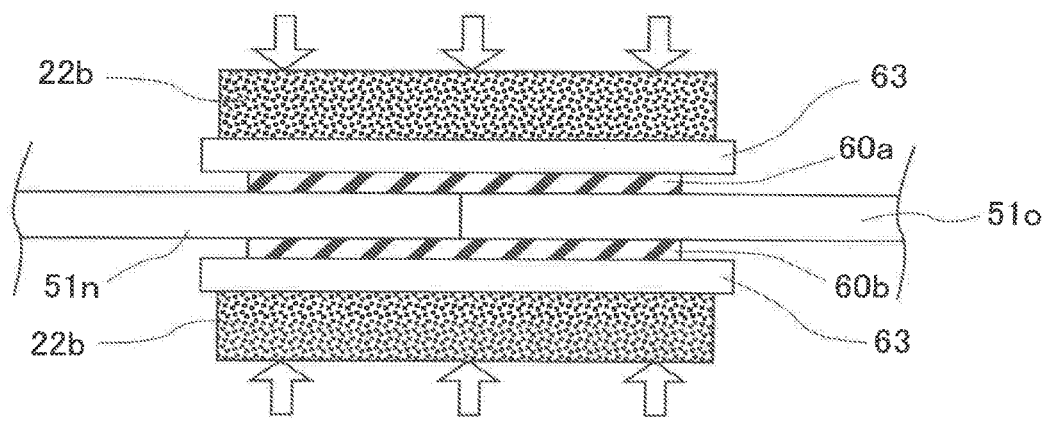
FIG. 8 is a diagram showing a state where the two splicing tapes each having a first sheet of the sheets of backing paper peeled off are affixed to the first carrier tape and the second carrier tape, respectively, by a pressure head.
Figure 9:
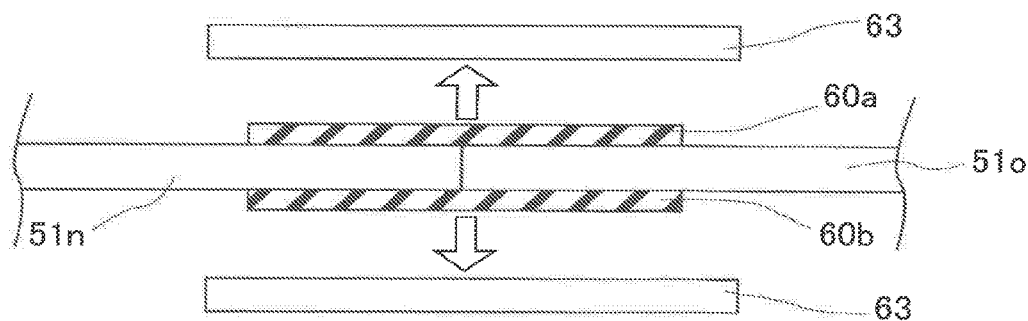
FIG. 9 is a diagram showing a state where a second remaining sheet of backing paper is peeled off from each of the two splicing tapes individually affixed to the first carrier tape and the second carrier tape.

Splicing device 22 includes a backing paper peel-off device (not shown) and pressure heads 22b. In splicing device 22, as shown in FIG. 7, affixing-side sheets of backing paper 62 of splicing tape portions 60a, 60b of splicing tapes 60 of splicing tape supply members 61 are peeled off from the affixing sides of splicing tape portions 60a, 60b by the backing paper peel-off device. Then, as shown in FIG. 8, two splicing tape portions 60a, 60b are disposed so as to sandwich a boundary portion between old carrier tape 51o and new carrier tape 51n from above and below, and then, two upper and lower pressure heads 22b are disposed in such a manner as to sandwich two splicing tape portions 60a and 60b from above and below are moved towards each other. Then, the affixing surface of splicing tape portion 60a comes to adhere to a front surface side of the boundary between old carrier tape 51o and new carrier tape 51n, and the affixing surface of splicing tape portion 60b comes to adhere to a rear surface side of the boundary between old carrier tape 51o and new carrier tape 51n. Thereafter, when the pressurization by pressure heads 22 b is completed, opposite-side sheets of backing paper 63 are peeled off from both splicing tape portions 60a, 60b by the backing paper peel-off device as shown in FIG. 9. As a result, splicing device 22 completes the designed splicing. When it completes the designed splicing, splicing device 22 is ready for its upper cover to be opened, so that carrier tape 51 on which the splicing is completed can be removed therefrom.

Control section 23 includes CPU and a memory and executes various processing in accordance with a predetermined program. Bar code reader 24 can communicate with control section 23. Bar code reader 24 can read individually feeder ID code 50a attached to tape feeder 50, bar code 52a attached to loaded reel 52o, bar code 52a attached to replenishing reel 52n, and bar code 65a attached to supply reel 65. When it reads these bar codes, bar code reader 24 transmits related information to control section 23. In the splicing operation, control section 23 not only executes a so-called splicing verification to check whether carrier tape 51 installing thereon correct components (that is, replenishing reel 52n) is prepared but also manages splicing tape supply members 61, that is, splicing tapes 60.

Communication section 26 is a section capable of communicating with host computer 30 via, for example, a wireless LAN. When it detects that bar code reader 24 reads barcode 52a of loaded reel 52o which is running out of components, control section 23 starts a splicing verification and transmits information on barcode 52a of loaded reel 52o to host computer 30 via communication section 26. When it detects that bar code reader 24 reads bar code 52a of replenishing reel 52n, control section 23 transmits information of bar code 52a of replenishing reel 52n to host computer 30 via communication section 26. Further, when it detects that bar code reader 24 reads barcode 65a of supply reel 65, control section 23 transmits information on barcode 65a of supply reel 65 to host computer 30 via communication section 26.

Host computer 30 includes CPU, a memory, and a control circuit and executes various processing in accordance with a predetermined program. Host computer 30 includes control unit 31, storage device 32, and communication section 33. Storage device 32 stores, for example, a control program for controlling component mounter 10 and the like, job data D1 and management data D2 for producing boards 40 as planned, and the like. Control unit 31 of host computer 30 can not only read and execute a control program from storage device 32 but also control or manage managing target devices such as component mounter 10 and splicing unit 20.

Job data D1 is data defining a production plan including, for example, positions and orders of components to be mounted on board 40 by component mounter 10, the number of boards to be produced, and the like. Host computer 30 transmits job data D1 to component mounter 10. Component mounter 10 mounts components on board 40 in accordance with job data D1 from host computer 30. In addition, component mounter 10 acquires component information such as component codes of components that can be supplied from installed tape feeders 50, maximum numbers of components that can be supplied, and the numbers of supplied (used) components and transmits the acquired component information to host computer 30 together with identification codes (i.e., feeder ID codes 50a and bar codes 52a) of tape feeders 50 and reels 52. When it receives the component information from component mounter 10, host computer 30 causes storage device 32 to store (manage) the component information in association with feeder ID code 50a or the like for each tape feeder 50 or each reel 52. Host computer 30 is capable of calculating time and date when tape feeder 50 runs out of components or the like. Host computer 30 calculates the time and date when tape feeder 50 runs out of components based, for example, on the number of residual components in tape feeder 50, the number of components used per one board 40 for production, the production speed of board 40, the reduction rate of components, and the like.

Management data D2 is data indicating, for example, whether tape feeder 50 or reel 52 is disposed in slot 12a of component mounter 10. Host computer 30 can store feeder IDs 50a of tape feeders 50 installed in component mounter 10, bar codes 52a of reels 52 installed in tape feeders 50, and component codes of components on carrier tapes 51 wound around reels 52 (for example, model numbers of components set by a manufacturer or the like) in storage device 32 in association with one another as management data D2.

Management data D2 stored in storage device 32 includes information on bar codes 52a of carrier tapes 51 and data on the component codes. When receiving information transmitted from control section 23 of splicing unit 20 via communication section 26 (specifically, bar codes 52*a* of loaded reels 52*o* or replenishing reels 52*n*) at communication section 33, control unit 31 of host computer 30 collates the received information with bar codes 52*a* received prior to start of execution of splicing to see whether component codes of installed components match with those of components to be installed.

When determining that the collation in installed components between loaded reel 52*o* and replenishing reel 52*n* is normal, control unit 31 of host computer 30 informs splicing unit 20 of a message to that respect. When receiving the message, control section 23 of splicing unit 20 automatically activates splicing device 22 to start splicing. When determining that the collation in installed components between loaded reel 52*o* and replenishing reel 52*n* is not normal, control unit 31 of host computer 30 informs splicing unit 20 of an occurrence of collation error. When receiving a message informing it of the occurrence of collation error from host computer 30, control section 23 of splicing unit 20 displays the message to that respect on display device 25 and halts splicing. In this way, control section 23 of splicing unit 20 can prevent an erroneous carrier tape 51, for example, installing a different type of components from being spliced by executing the processing linked with host computer 30.

Management data D2 stored in storage device 32 includes barcode 65*a* of supply reel 65. Information in bar code 65*a* may include information on, for example, an identification code of splicing tape supply member 61, a production period such as production date and a usable period after production (for example, one year or three years) of splicing tape supply member 61, a manufacturer of splicing tape supply member 61, and the like. The information in bar code 65*a* may also include information on, for example, a read date when this bar code 65*a* is read by bar code reader 24 or a starting time in use such as a package opening date when splicing tape supply member 61 is taken out from an individually sealed bag or box for use, a usable period after starting time, and the like. Note that the usable period after production and the usable period after starting time may each be defined as a period in which the adhesion force of splicing tape 60 is expected to decrease to a predetermined value under a normal use environment, and the usable periods may be different from each other.

Figure 11:
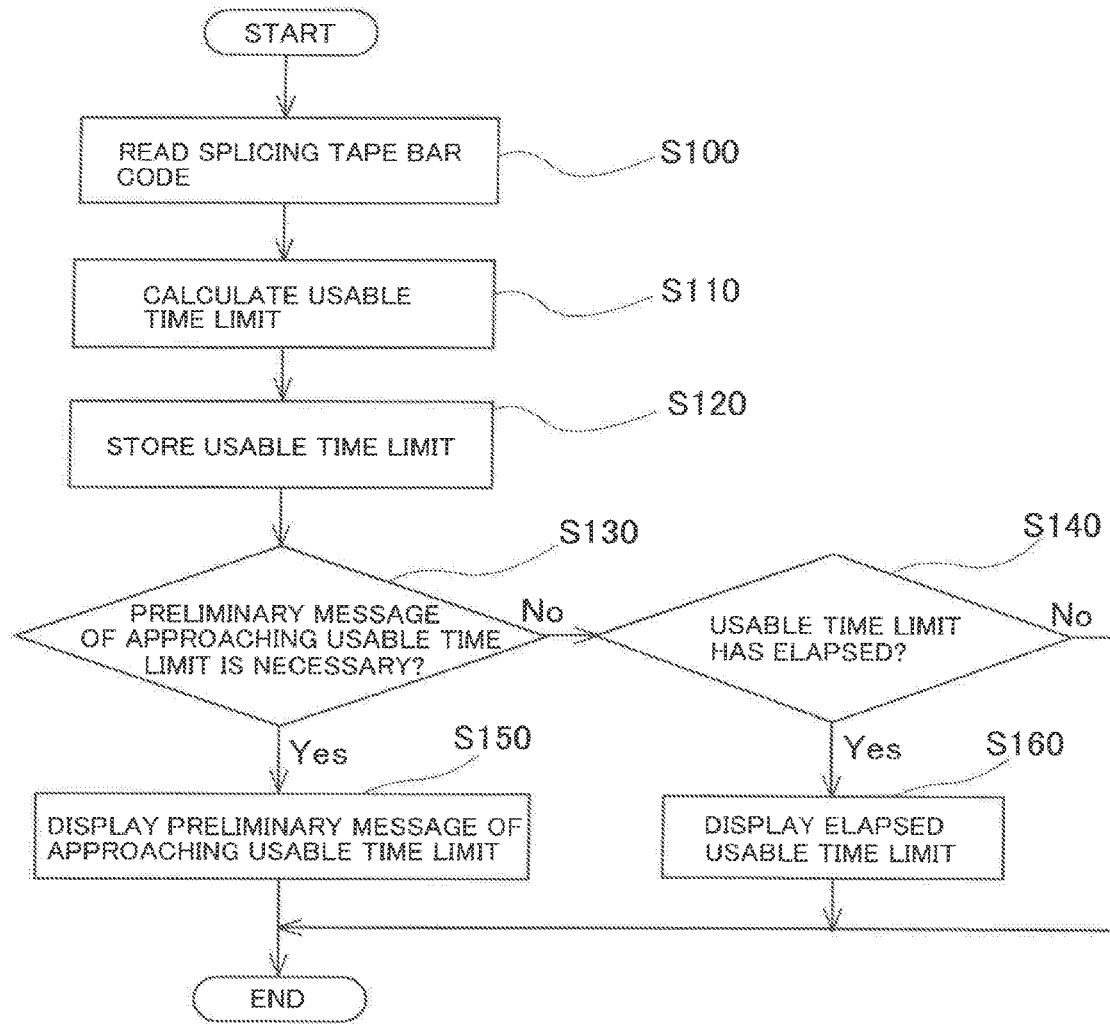
FIG. 11 is an exemplified flow chart of a control routine executed to manage a usable time limit of a splicing tape in the present embodiment.

When receiving the information on bar code 65*a* of supply reel 65 transmitted from splicing unit 20 via communication section 26 at communication section 33 in step S100 shown in FIG. 11, from this point on, host computer 30 manages splicing tape supply member 61, that is, splicing tape 60 wound around supply reel 65. In addition, control section 23 of splicing unit 20 acquires information on, for example, a maximum number of splicing tapes 60 that can be supplied from splicing tape supply member 61 of supply reel 65 installed in splicing device 22 and the number of splicing tapes 60 that have been supplied (that is, used). Then, control section 23 of splicing unit 20 transmits the acquired information to host computer 30 together with the identification code (that is, bar code 65*a*) of splicing tape 60. Upon receiving the information from splicing unit 20, control unit 31 of host computer 30 stores the information in storage device 32 in association with the identification code of splicing tape 60 indicated by bar code 65*a* or updates the information stored in storage device 32.

As part of the management of splicing tape 60 wound around supply reel 65, control unit 31 of host computer 30 first manages the usable time limit of splicing tape 60. Control unit 31 includes usable time limit calculating section 31*a*, first storage control section 31*b*, and usable time limit determination section 31*c*. When starting the management of splicing tape 60, firstly, usable time limit calculating section 31*a* calculates a time limit for using splicing tape 60 based on the production period and the usable period after production of splicing tape 60 included in bar code 65*a* in step S110. Alternatively, usable time limit calculating section 31*a* calculates a timing at which the use of splicing tape 60 is to be halted (that is a usable time limit) based on the start of use time and the usable period after starting time of splicing tape 60 included in bar code 65*a*. Then, in step S120, first storage control section 31*b* causes storage device 32 to store therein information on the usable time limit calculated as described above in association with the identification code of splicing tape 60 indicated by barcode 65*a* of supply reel 65.

After storage device 32 has stored the information, control unit 31 of host computer 30 manages the use of splicing tape 60 wound around supply reel 65 loaded in splicing device 22 based on the usable time limit associated with splicing tape 60 stored in storage device 32. Specifically, usable time limit determination section 31*c* determines in step S130 whether the usable time limit of splicing tape 60 of supply reel 65 loaded in splicing device 22 is predicted of its elapsing by comparing the usable time limit stored in storage device 32 with the present point in time. This prediction need only be affirmative when the usable time limit is predicted to be reached within a predetermined period of time. The predetermined period of time need only be set at a period of time required for replacement of supply reels 65 around which splicing tape 60 is wound or longer and may be determined in advance. Further, in step S140, usable time limit determination section 31*c* determines whether the usable time limit of splicing tape 60 elapses by comparing the usable time limit stored in storage device 32 with the present point in time point.

When it determines in step S130 that the usable time limit is predicted to elapse, control unit 31 informs control section 23 of splicing unit 20 via communication section 33 that the usable time limit of splicing tape 60 of supply reel 65 loaded in splicing device 22 is approaching or is to be reached soon (hereinafter, referred to as a "preliminary message of approaching usable-time limit"). In addition, when it determines in step S140 that the usable time limit has elapsed, control unit 31 informs splicing unit 20 via communication section 33 that the use of splicing tape 60 of supply reel 65 loaded in splicing device 22 should be stopped (hereinafter, referred to as a "message of elapsed usable-time limit"). When communication section 26 receives the preliminary message of approaching usable-time limit or the message of elapsed usable-time limit from host computer 30, control section 23 issues a warning to the operator, the preliminary message of approaching usable-time limit or the message of elapsed usable-time limit, those related to the usable time limit.

Display device 25 is connected to control section 23. Display device 25 has a display function and an input function. When receiving the preliminary message of approaching usable-time limit from host computer 30, control section 23 of splicing unit 20 causes display device 25 to display thereon a preliminary notice reading that the usable time limit of splicing tape 60 of supply reel 65 is approaching or is soon to be reached in a step S150. In addition, when receiving the message of elapsed usable-time limit from host computer 30, control section 23 causes display device 25 to display thereon an abnormal situation occurring message reading that the usable time limit of splicing tape 60 on supply reel 65 has elapsed in step S160.

Display device 25 displays the preliminary notice or the abnormal situation occurring notice according to the instruction from control section 23. Note that the preliminary notice need only include the approaching usable time limit, the number of days or hours left before the usable time limit is reached, and the like and that the whole of a screen of display device 25 may be colored, for example, in yellow to inform that the usable time limit is approaching or is to be reached soon as part of the preliminary notice. Additionally, the abnormal situation occurring notice need only include the usable time limit and a message letting the operator recognize that no more splicing is to be executed when splicing device 22 is caused to stop splicing as will be described later, and the whole of the screen of display device 25 may be colored, for example, in red to inform that the usable time limit has already elapsed as part of the abnormal situation occurring notice. As a result of these displays, the operator can be encouraged or instructed to replace supply reel 65 around which splicing tape 60 in question is wound with a proper one.

When receiving the message of elapsed usable-time limit from host computer 30, control section 23 of splicing unit 20 desirably halts the splicing by splicing device 22 using splicing tape 60 whose usable time limit has elapsed.

When the warnings are displayed, the operator can not only recognize that the usable time limit of splicing tape 60 of supply reel 65 loaded in splicing device 22 is approaching or is to be reached soon but also recognize that the usable time limit of splicing tape 60 in question has elapsed by visually confirming the screen of display device 25. In this case, the operator can resume the splicing by splicing unit 20 by replacing supply reel 65 currently loaded in splicing device 22 with a fresh or new one. A configuration may be adopted in which control section 23 automatically stops or resumes the splicing by splicing device 22 by the operator touching the screen of display device 25 in predetermined ways at the start of or after completion of replacement of that supply reel 65 with a fresh or new one.

Further, as part of the management of splicing tape 60 wound around supply reel 65, control unit 31 of host computer 30 manages the success rate of splicing for each supply reel 65. This success rate is a ratio of the total number of times of splicing performed using splicing tape 60 of supply reel 65 on which splicing tape 60 of the same model number, that is, the same type is wound to the number of times of successful splicing. However, in the case where there are multiple supply reels 65 around which splicing tape 60 produced by the same manufacturer and at substantially the same production period is wound, the above success rate may be calculated on those multiple supply reels 65 altogether as one.

Success or failure of each splicing can be confirmed in a final step of the splicing by splicing device 22. This success/failure confirmation may be executed using splicing device 22 which can automatically confirm the success/failure of splicing, or may be executed manually by the operator who visually determines on the success/failure of splicing and inputs the results of the determination by touching a touch panel of display device 25 of splicing unit 20. Every time splicing is executed, control section 23 of splicing unit 20 transmits the result, that is, success or failure of splicing to host computer 30 via communication section 26.

Figure 12:
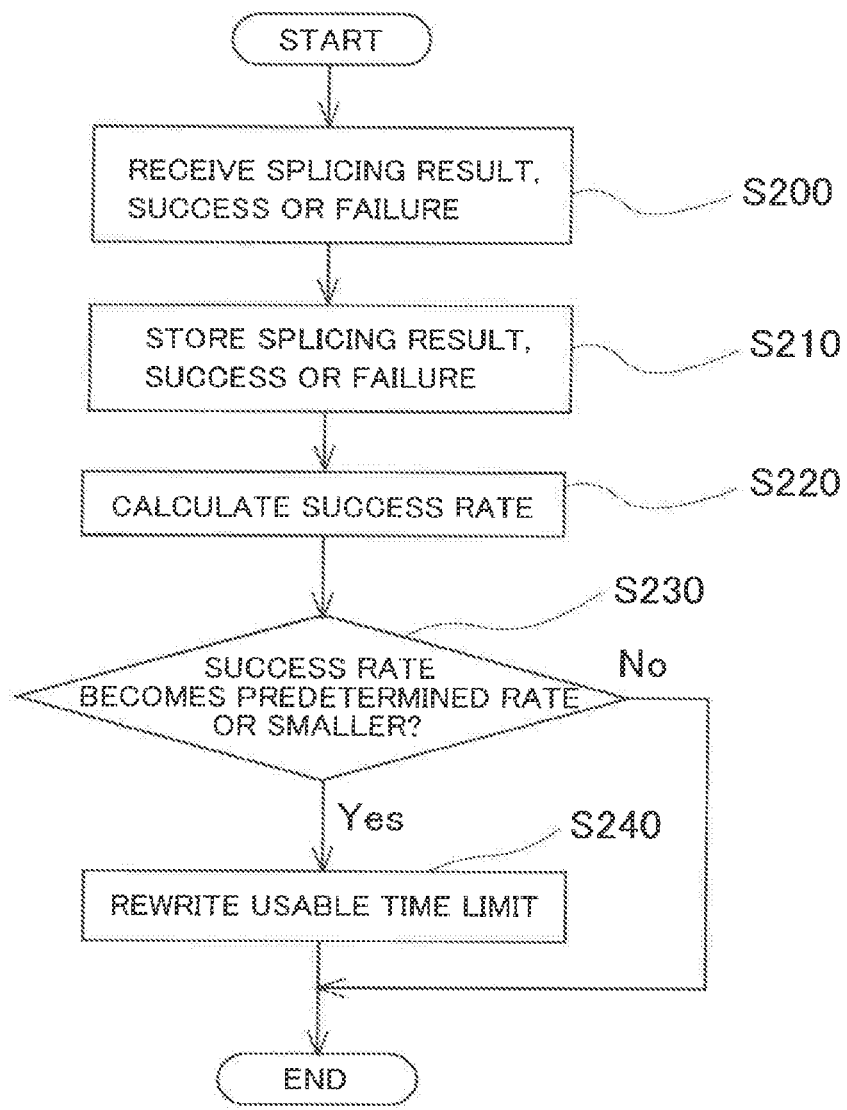
FIG. 12 is an exemplified flow chart of a control routine executed to control the success rate of splicing using a splicing tape in the present embodiment.

Control unit 31 of host computer 30 includes second storage control section 31d and success rate calculating section 31e. When communication section 33 receives the result, that is, success or failure of splicing from splicing unit 20 in step S200 shown in FIG. 12, second storage control section 31d causes storage device 32 to store the result, that is, success or failure of splicing in association with the identification code of splicing tape 60 used that is linked with bar code 65a of supply reel 65 in step S210. In storing the results of splicing, that is, successes or failures of splicing, the result, that is, success or failure of each splicing may be stored one by one, or, as shown in FIG. 10, both a total number of times of splicing and the number of times of successful splicing may be stored. Then, in step S220, success rate calculating section 31e calculates a success rate of splicing using the supply reel 65 based on the results, that is, successes or failures of splicing stored in storage device 32. The success rate need only be calculated by updating the previous success rate each time the result, that is, success or failure of splicing is received from splicing unit 20.

When success rate calculating section 31e calculates a success rate of splicing using splicing tape 60 wound around supply reel 65 as described above, control unit 31 determines whether the success rate so calculated is a predetermined rate or lower in step S230. This predetermined rate is a value set at a boundary value of a success rate at which the work efficiency of the operator is determined to be lowered by the failure of splicing and may be a predetermined value, which is, for example, 80% or 90%. In order to ensure the reliability of the determination, the determination may be such as to be executed on and after a point in time when a parameter of splicing (that is, a total number of times of splicing) in calculating a success rate reaches a predetermined number of times or more.

Control unit 31 includes time limit rewriting unit section 31f. When it determines that the success rate described above exceeds the predetermined rate, control unit 31 ends the processing routine without proceeding with any further processing from then on. On the other hand, when it determines that the success rate is the predetermined rate or smaller, control unit 31 executes the following processing. That is, in this instance, since there is a possibility that splicing tape 60 of supply reel 65 is degraded in quality, time limit rewriting section 31f rewrites the usable time limit of splicing tape 60 in question stored in storage device 32 to the present point in time (i.e., the point in time when the success rate becomes the predetermined rate or smaller) in step S240. Immediately after the rewriting is executed, determining in step S140 that the usable time limit has elapsed as described above, control unit 31 issues the message of elapsed usable-time limit to splicing unit 20 and causes display device 25 to display the abnormal situation occurring message thereon. When splicing unit 20 receives the message of elapsed usable-time limit from host computer 30, display device 25 displays the abnormal situation occurring message thereon.

In displaying the abnormal situation occurring message on display device 25, a message reading that the success rate of splicing has decreased to the predetermined rate or lower may be made visually recognizable by the operator. As a result of this display, the operator can not only be instructed to replace feed reel 65 around which splicing tape 60 in question is wound with a fresh or new one but also be made to recognize that the success rate of splicing using splicing tape 60 in question has decreased, whereby the operator can be informed that the replacement of supply reel 65 in question is attributed to the reduction in success rate.

In addition, the splicing success rate itself is desirably displayed so as to be visualized by the operator regardless of whether the success rate of splicing using supply reel 65 has decreased to the predetermined rate or lower, that is, regardless of whether the abnormal situation occurring message is displayed on display device 25. That is, it is preferable that after control unit 31 calculates a success rate of splicing in step S220, control unit 31 transmits information on the success rate so calculated to splicing unit 20 so as to be displayed on display device 25 thereof. In this case, control unit 31 of host computer 30 transmits the information on the success rate of splicing to splicing unit 20. Upon receiving the information on the success rate from host computer 30, splicing unit 20 displays the success rate so received on display device 25. As a result of this display, the operator is allowed to recognize the success rate of splicing using splicing tape 60 in question.

2. Advantageous Effects of the Configuration of the Embodiment

As has been described heretofore, splicing tape management system 1 of the present embodiment includes storage device 32 configured to store the identification code of splicing tape 60 configured to splice old carrier tape 51o and new carrier tape 51n and the usable time limit of splicing tape 60 in association with each other. Splicing tape management system 1 includes control unit 31 of host computer 30 configured to manage the use of splicing tape 60 based on the identification code and the usable time limit of splicing tape 60 stored in storage device 32 and splicing unit 20. According to this configuration, since the identification code of splicing tape 60 configured to splice old carrier tape 51o and new carrier tape 51n together and the usable time limit thereof are linked with each other, the usable time limit management of splicing tape 60 in question can be appropriately executed. Therefore, the quality of splicing tape 60 to be used can be ensured, whereby splicing tape 60 can be properly used.

Further, in splicing tape management system 1, the usable time limit is a time limit for halting use of splicing tape 60 that is determined based on the production time and the usable period after production of splicing tape 60 or based on the starting time in use and the usable period after starting time of splicing tape 60. According to this configuration, the timing at which the use of splicing tape 60 is halted can be managed properly.

Additionally, splicing tape management system 1 includes splicing unit 20 configured to splice old carrier tape 51o and new carrier tape 51n together using splicing tape 60. Splicing unit 20 includes supply reel holding section 21b configured to hold supply reel 65 around which splicing tape 60 is wound. Splicing unit 20 includes splicing device 22 configured to affix splicing tape 60 of supply reel 65 held by supply reel holding section 21b to both old carrier tape 51o and new carrier tape 51n. Splicing unit 20 includes bar code reader 24 configured not only to communicate with control unit 31 but also to read bar code 65a attached to supply reel 65 to indicate the identification code of splicing tape 60. Control unit 31 of host computer 30 includes usable time limit calculating section 31a configured to obtain a usable time limit of splicing tape 60 of supply reel 65 when bar code 65a attached to supply reel 65 held by supply reel holding section 21b is acquired through communication connection after having been read by bar code reader 24. Control unit 31 includes first storage control section 31b configured to cause storage device 32 to store therein the usable time limit obtained by usable time limit calculating section 31a in association with the identification code of splicing tape 60 of supply reel 65.

According to this configuration, bar code 65a attached to supply reel 65 held by supply reel holding section 21b is read by bar code reader 24. Thereafter, when control unit 31 of host computer 30 acquires bar code 65a, control unit 31 obtains a usable time limit of splicing tape 60 and causes storage device 32 to store therein the usable time limit so obtained in association with the identification code of splicing tape 60 in question. This enables the time limit management of splicing tape 60 to be executed appropriately for each identification code of splicing tape 60, that is, for each supply reel 65.

In addition, in splicing tape management system 1, control unit 31 includes usable time limit determination section 31c configured to determine whether the usable time limit stored in storage device 32 has elapsed or is predicted to elapse. According to this configuration, whether the usable time limit of splicing tape 60 has elapsed or whether the usable time limit is predicted to elapse can be determined.

In addition, splicing unit 20 includes display device 25 configured to issue to the operator a warning regarding the usable time limit of splicing tape 60 when it is detected that the usable time limit has elapsed or predicted that the usable time limit elapses as a result of the determination by usable time limit determination section 31c. According to this configuration, when the usable time limit of splicing tape 60 has elapsed or is predicted to elapse, the operator who is executing splicing can be informed that the useable time limit has elapsed or be preliminarily informed that the usable time limit is approaching or is to be reached soon through display device 25.

Additionally, splicing tape management system 1 includes storage device 32 configured to store the result, that is, success or failure of splicing old carrier tape 51o and new carrier tape 51n together using splicing tape 60 in association with the identification code of splicing tape 60 in question. Control unit 31 of host computer 30 includes second storage control section 31d configured to cause storage device 32 to store therein the result, that is, success or failure of splicing after the splicing has been executed in association with the identification code of splicing tape 60. Control unit 31 includes success rate calculating section 31e configured to calculate a success rate of splicing old carrier tape 51o and new carrier tape 51n together for each identification code of splicing tape 60 based on the results, that is, successes or failures of splicing stored in storage device 32.

According to this configuration, the result, that is, success or failure of each splicing using splicing tape 60 can be stored in association with the identification code of splicing tape 60 in question, and a success rate of splicing can be calculated for each identification code, that is, for each supply reel 65. Therefore, the quality of splicing tape 60 to be used can be grasped to some extent, and the reliability of splicing using splicing tape 60 can be grasped.

In addition, control unit 31 of host computer 30 includes time limit rewriting section 31f configured to rewrite, when the success rate calculated by success rate calculating section 31e becomes the predetermined rate or smaller, the usable time limit that is associated with the identification code of splicing tape 60 that is stored in storage device 32 to the point in time when the success rate becomes the predetermined rate or smaller. According to this configuration, when the success rate of splicing decreases to the predetermined rate or smaller, since the usable time limit stored in storage device 32 is rewritten to that point in time, the management of splicing tape 60 whose quality could be decreased can be executed properly.

Splicing unit 20 includes display device 25 configured to display the success rate of splicing calculated by success rate calculating section 31e for each identification code of splicing tape 60. According to this configuration, the operator is allowed to recognize the success rate of splicing using splicing tape 60.

In the embodiment described heretofore, old carrier tape 50o and new carrier tape 50n correspond to a "first carrier tape" and a "second carrier tape" that are described in claims below. Control unit 31 of host computer 30 and splicing unit 20 correspond to a "management section" that is described in the claims below. Display device 25 corresponds to a "warning section" and a "display section" that are described in the claims below. Bar code reader 24 corresponds to an "ID code reader" that is described in the claims below. Storage device 32 of host computer 30 corresponds to a "first storage section" and a "second storage section" that are described in the claims below.

3. Modified Examples of the Embodiment

In the embodiment described above, when it detects that the usable time limit of splicing tape 60 has elapsed or predicts that the useable time limit elapses, control unit 31 of host computer 30 issues the message of elapsed usable-time limit or the preliminary message of approaching usable-time limit to splicing unit 20. Then, control section 23 of splicing unit 20 instructs display device 25 to display the preliminary message of approaching usable-time limit or the abnormal situation occurring message, and display device 25 displays the warning regarding the usable time limit of splicing tape 60. However, the present disclosure is not limited to this configuration. For example, a configuration may be adopted in which control section 23 of splicing unit 20 instructs an alarm device that splicing unit 20 includes to issue an alarm by means of voice or using a buzzer, and the alarm device issues an audio alarm or buzzer alarm as a warning regarding the usable time limit of splicing tape 60.

In the embodiment described heretofore, control section 23 of splicing unit 20 reads barcode 65a of supply reel 65 via bar code reader 24, then control section 23 sends bar code 65 in question to host computer 30. Then, control unit 31 of host computer 30 calculates a usable time limit of splicing tape 60, causes storage device 32 to store therein the usable time limit so calculated, and manages the use of splicing tape 60 in question. However, the present disclosure is not limited to this configuration. A configuration may be adopted in which control section 23 of splicing unit 20 reads bar code 65a, calculates a usable time limit of splicing tape 60, causes a storage device incorporated in splicing unit 20 to store therein the usable time limit so calculated, and manages the use of splicing tape 60.

Further, in the embodiment described above, storage device 32 of host computer 30 is caused to store therein both the usable time limit of splicing tape 60 and the result, that is, success or failure of splicing using splicing tape 60. However, the present disclosure is not limited to this configuration. A configuration may be adopted in which storage device 32 of host computer 30 is caused to store therein either the usable time limit of splicing tape 60 or the result, that is, success or failure of splicing using splicing tape 60, and a storage device incorporated in splicing unit 20 is caused to store therein the other.

In the embodiment described heretofore, the success rate of splicing for each supply reel 65 is calculated based on the result, that is, success or failure of each splicing, and when the success rate becomes the predetermined rate or smaller, the usable time limit of splicing tape 60 of supply reel 65 in question is rewritten to the point in time when the success rate becomes the predetermined rate or smaller. However, the present disclosure is not limited to this configuration. The adhesive force working between splicing tape 60 and carrier tape 51 when they are spliced together changes in accordance with the temperature environment, the pressing time and pressing force by the pressure heads 22b, and the like. In general, the higher the temperature, the softer the adhesive, increasing the viscosity of the adhesive more, whereby the adhesive force is increased accordingly. Further, the longer the pressurizing time of the pressure heads 22b or the greater the pressurizing force, the greater the degree of adhesion between the adhesive and the splicing tape 60 and the carrier tapes 51, whereby the adhesive force described above increases accordingly.

Then, for example, let's assume that splicing device 22 includes a heater such as an electric heater (that is, a temperature control unit) capable of increasing the environmental temperature when splicing old carrier tape 51o and new carrier tape 51n together using splicing tape 60. Then, when the success rate of splicing using supply reel 65 becomes the predetermined rate or smaller, control section 23 of splicing unit 20 need only activate the heater to operate to increase the environmental temperature higher than before at the time of splicing carrier tapes 51 using supply reel 65 in question. According to this modified example, the adhesive force between splicing tape 60 and carrier tapes 51 can be increased when splicing those tapes together after the success rate of splicing becomes the predetermined rate or smaller. This can serve to avoid a possible waste of splicing tape 60 attributed to the reduction in success rate of splicing as much as possible.

Further, for example, a configuration may be adopted in which after the success rate of splicing using supply reel 65 becomes the predetermined rate or smaller, control section 23 of splicing unit 20 need only increase the pressurizing time or pressurizing force by pressure heads 22b when executing splicing higher than before the success rate becomes the predetermined rate or smaller. Also in this modified example, the adhesive force working between splicing tape 60 and carrier tapes 51 can be increased when splicing those tapes together after the success rate of splicing becomes the predetermined rate or smaller. This can serve to avoid a possible waste of splicing tape 60 attributed to the reduction in success rate of splicing as much as possible.

In the embodiment described heretofore, the result, that is, success or failure of each splicing using splicing tape 60 is stored in storage device 32 in association with the identification code of splicing tape 60 in question. However, a configuration may be adopted in which splicing unit 20 includes a thermometer for detecting a temperature (preferably, a temperature in particular in a housing of splicing device 22 where splicing is executed), and the result, that is, success or failure of splicing is stored in storage device 32 together with the temperature detected using the thermometer when the splicing is executed. According to this modified example, the success or failure of each splicing can be liked with the temperature, whereby the correlation between the success rate of splicing and the temperature for each splicing tape 60 can be grasped. As a result, the execution conditions of splicing can appropriately be determined. The temperature stored in storage device 32 may individually be associated with the result, that is, success or failure of each splicing or may be an average temperature over all the splicing that is linked with the success rate based on the results, that is, successes or failures.

Further, the result, that is, success or failure of splicing may be stored in storage device 32 together with the pressurizing time and the pressurizing force that are required by pressure heads 22b in attaching splicing tape 60 to carrier tapes 51 when the splicing is performed. According to this modification, the success or failure of each splicing can be linked with the pressurizing time and the pressurizing force, and the correlation between the success rate of splicing for each splicing tape 60 and the pressurizing time and the pressurizing force can be grasped. As a result, the execution conditions of splicing can appropriately be determined. The pressurizing time and the pressurizing force that are stored in storage device 32 may be individually associated with the result, that is, success or failure of each splicing, or may be the average pressurizing time and the average pressurizing force over all the splicing that is linked with the success rate based on the results, that is, successes or failures.

REFERENCE SIGNS LIST

1: splicing tape management system; 10: component mounter; 20: splicing unit; 22: splicing device; 23: control section; 24: bar code reader; 25: display device; 30: host computer; 31: control unit; 31a: usable time limit calculating section; 31b: first storage control section; 31d: second storage control section; 31e: success rate calculating section; 31f: time limit rewriting section; 32: storage device; 50: tape feeder; 51: carrier tape; 51o: old carrier tape; 51n: new carrier tape; 52: reel; 52a: reel bar code; 52o: loaded reel; 52n: replenishing reel; 60: splicing tape; 60a, 60b: splicing tape portion; 61: splicing tape supply member; 62: backing paper (affixing side backing paper); 63: backing paper (opposite side backing paper); 65: supply reel; 65a: bar code of supply reel.

The invention claimed is:

1. A splicing tape management system comprising:
a splicing unit configured to splice together a first carrier tape and a second carrier tape using a splicing tape, the splicing unit including:
a holder configured to hold a reel around which the splicing tape is wound; and
a bonding device configured to affix the splicing tape of the reel held by the holder to both the first carrier tape and the second carrier tape; and
circuitry programmed to:
calculate a usable time limit of the splicing tape based on a time of production of the splicing tape and a usable period after the production of the splicing tape,
store an identification code of the splicing tape associated with the usable time limit of the splicing tape, and
manage the use of the splicing tape by the splicing unit to splice together the first carrier tape and the second carrier tape based on the identification code and the usable time limit.

2. The splicing tape management system according to claim 1, wherein the usable time limit is a timing when the use of the splicing tape is to be halted.

3. The splicing tape management system according to claim 1, wherein
the splicing unit further includes:
an ID code reader configured to be communicably connected to the circuitry and read an ID code attached to the reel to indicate the identification code of the splicing tape, and
the circuitry is programmed to calculate the usable time limit of the splicing tape of the reel when the ID code, attached to the reel held by the holder, is acquired through the communicable connection after the ID code reader reads the ID code.

4. The splicing tape management system according to claim 1, wherein the circuitry is programmed to determine whether the usable time limit has elapsed or will elapse within a predetermined period of time.

5. The splicing tape management system according to claim 4, wherein the circuitry is programmed to issue a warning regarding the usable time limit of the splicing tape to an operator when the circuitry determines that usable time limit has elapsed or will elapse within the predetermined period of time.

6. The splicing tape management system according to claim 1, wherein the circuitry is programmed to:
store a success or failure of splicing together the first carrier tape and the second carrier tape using the splicing, after the splicing has been executed, in association with the identification code of the splicing tape; and
calculate a success rate of splicing together the first carrier tape and the second carrier tape for the splicing tape based on the success or failure.

7. The splicing tape management system according to claim 6, wherein the circuitry is programmed to, when the success rate becomes a predetermined rate or smaller, rewrite the usage time limit associated with the identification code of the splicing tape to a point in time when the success rate becomes the predetermined rate or smaller.

8. The splicing tape management system according to claim 6, wherein the circuitry is programmed to, after the success rate becomes a predetermined rate or smaller, raise a temperature in executing the splicing to be higher than the temperature before the success rate became the predetermined rate or smaller.

9. The splicing tape management system according to claim 6, wherein the circuitry is programmed to store the success or failure in association with the identification code of the splicing tape together with a temperature at which the splicing is executed.

10. The splicing tape management system according to claim 6, wherein the circuitry is programmed to store the success or failure in association with the identification code of the splicing tape together with a pressurizing time required to affix the splicing tape when the splicing is executed.

11. The splicing tape management system according to claim 6, wherein the circuitry is programmed to cause a display to display the success rate for the identification code of the splicing tape.

12. A splicing tape management system comprising:
a splicing unit configured to splice together a first carrier tape and a second carrier tape using a splicing tape, the splicing unit including:
a holder configured to hold a reel around which the splicing tape is wound; and
a bonding device configured to affix the splicing tape of the reel held by the holder to both the first carrier tape and the second carrier tape; and
circuitry programmed to:
calculate a usable time limit of the splicing tape based on a time of starting use of the splicing tape and a usable period after the starting the use of the splicing tape,
store an identification code of the splicing tape associated with the usable time limit of the splicing tape, and manage the use of the splicing tape by the splicing unit to splice together the first carrier tape and the second carrier tape based on the identification code and the usable time limit.

13. The splicing tape management system according to claim 12, wherein the usable time limit is a timing when the use of the splicing tape is to be halted.

14. The splicing tape management system according to claim 12, wherein
the splicing unit further includes:
an ID code reader configured to be communicably connected to the circuitry and read an ID code attached to the reel to indicate the identification code of the splicing tape, and
the circuitry is programmed to calculate the usable time limit of the splicing tape of the reel when the ID code, attached to the reel held by the holder, is acquired through the communicable connection after the ID code reader reads the ID code.

15. The splicing tape management system according to claim 12, wherein the circuitry is programmed to determine whether the usable time limit has elapsed or will elapse within a predetermined period of time.

16. The splicing tape management system according to claim 15, wherein the circuitry is programmed to issue a warning regarding the usable time limit of the splicing tape to an operator when the circuitry determines that usable time limit has elapsed or will elapse within the predetermined period of time.

17. The splicing tape management system according to claim 12, wherein the circuitry is programmed to:
store a success or failure of splicing together the first carrier tape and the second carrier tape using the splicing, after the splicing has been executed, in association with the identification code of the splicing tape; and
calculate a success rate of splicing together the first carrier tape and the second carrier tape for the splicing tape based on the success or failure.

18. The splicing tape management system according to claim 17, wherein the circuitry is programmed to, when the success rate becomes a predetermined rate or smaller, rewrite the usage time limit associated with the identification code of the splicing tape to a point in time when the success rate becomes the predetermined rate or smaller.

19. The splicing tape management system according to claim 17, wherein the circuitry is programmed to, after the success rate becomes a predetermined rate or smaller, raise a temperature in executing the splicing to be higher than the temperature before the success rate became the predetermined rate or smaller.

20. The splicing tape management system according to claim 17, wherein the circuitry is programmed to store the success or failure in association with the identification code of the splicing tape together with a temperature at which the splicing is executed.

21. The splicing tape management system according to claim 17, wherein the circuitry is programmed to store the success or failure in association with the identification code of the splicing tape together with a pressurizing time required to affix the splicing tape when the splicing is executed.

22. The splicing tape management system according to claim 17, wherein the circuitry is configured to cause a display to display the success rate for the identification code of the splicing tape.

* * * * *